(12) United States Patent
Yoon et al.

(10) Patent No.: US 11,600,512 B2
(45) Date of Patent: Mar. 7, 2023

(54) SUBSTRATE PROCESSING APPARATUS AND ROTATING ELECTRICAL CONNECTOR FOR VACUUM

(71) Applicant: Jusung Engineering Co., Ltd., Gwangju-si (KR)

(72) Inventors: Ho Bin Yoon, Gwangju-si (KR); Seung Chul Shin, Gwangju-si (KR); Jin Hyuk Yoo, Gwangju-si (KR)

(73) Assignee: Jusung Engineering Co., Ltd., Gwangju-si (KR)

(*) Notice: Subject to any disclaimer, the term of this patent is extended or adjusted under 35 U.S.C. 154(b) by 0 days.

(21) Appl. No.: 17/822,704

(22) Filed: Aug. 26, 2022

(65) Prior Publication Data

US 2022/0415692 A1    Dec. 29, 2022

Related U.S. Application Data

(60) Division of application No. 16/618,710, filed on Dec. 2, 2019, now Pat. No. 11,469,130, which is a
(Continued)

(30) Foreign Application Priority Data

Jun. 16, 2017  (KR) .......................... 1020170076714
Jun. 16, 2017  (KR) .......................... 1020170076715

(51) Int. Cl.
*H01L 21/683*   (2006.01)
*H01R 39/08*    (2006.01)
(Continued)

(52) U.S. Cl.
CPC .... *H01L 21/6833* (2013.01); *H01J 37/32715* (2013.01); *H01R 39/08* (2013.01);
(Continued)

(58) Field of Classification Search
CPC ........... H01L 21/6833; H01J 37/32715; H01R 39/08; H01R 39/26
See application file for complete search history.

(56) References Cited

U.S. PATENT DOCUMENTS 5,557,215 A     9/1996  Saeki et al.
10,490,434 B2 * 11/2019 Swaminathan ... H01L 21/68785
(Continued)

FOREIGN PATENT DOCUMENTS

JP  2000100916 A  4/2000
JP  2003133233 A  5/2003
(Continued)

OTHER PUBLICATIONS

Office Action dated Jul. 26, 2022 for Japanese Patent Application No. 2019-565823; 4 pgs.; Japan Patent Office, Tokyo, Japan.
(Continued)

*Primary Examiner* — Scott Bauer
(74) *Attorney, Agent, or Firm* — Andrew D. Fortney; Central California IP Group, P.C.

(57) ABSTRACT

A substrate processing apparatus includes: a disk including a plurality of electrostatic chucks periodically disposed at a constant radius from a central axis; a disk support supporting the disk; a DC line electrically connected to the plurality of electrostatic chucks through the disk support; and a power supply configured to supply power to the DC line. The DC line includes: a first DC line penetrating through the disk support from the power supply; a power distribution unit configured to distribute the first DC line to connect the first DC line to each of the plurality of electrostatic chucks; and a plurality of second DC lines respectively connected to the plurality of electrostatic chucks in the power distribution unit.

11 Claims, 13 Drawing Sheets

Related U.S. Application Data continuation of application No. PCT/KR2018/006511, filed on Jun. 8, 2018.

(51) Int. Cl.
*H01J 37/32* (2006.01)
*H01R 39/26* (2006.01)

(52) U.S. Cl.
CPC .... *H01R 39/26* (2013.01); *H01J 2237/20214* (2013.01); *H01J 2237/332* (2013.01)

(56) References Cited

U.S. PATENT DOCUMENTS

| | | | |
|---|---|---|---|
| 2005/0241580 A1* | 11/2005 | Park | C23C 16/42 118/715 |
| 2008/0258411 A1* | 10/2008 | Miura | H01L 21/67109 279/128 |
| 2012/0006489 A1 | 1/2012 | Okita et al. | |
| 2013/0048217 A1 | 2/2013 | Shiraiwa | |
| 2014/0290862 A1* | 10/2014 | Sugi | H01L 21/6833 118/728 |
| 2015/0255258 A1 | 9/2015 | Nozawa et al. | |
| 2016/0153086 A1* | 6/2016 | Kwak | C23C 16/50 118/723 R |
| 2016/0230269 A1 | 8/2016 | Raj et al. | |

FOREIGN PATENT DOCUMENTS

| | | |
|---|---|---|
| JP | 2003347228 A | 12/2003 |
| JP | 2007-265847 A | 10/2007 |
| JP | 2011-187566 A | 9/2011 |
| JP | 2013044047 A | 3/2013 |
| JP | 2014049667 A | 3/2014 |
| KR | 10-2016-0073281 A | 6/2016 |
| KR | 10-2017-0017855 A | 2/2017 |
| KR | 10-2017-0027641 A | 3/2017 |
| WO | 2016126360 A1 | 8/2016 |

OTHER PUBLICATIONS

Ki Bum Kim et al.; "Substrate Producing Apparatus Arranged in Process Chamber"; Bibliographic Data of KR20160073281 (A); Jun. 24, 2016.

* cited by examiner

I-I'

II-II'

SUBSTRATE PROCESSING APPARATUS AND ROTATING ELECTRICAL CONNECTOR FOR VACUUM

CROSS-REFERENCE TO RELATED APPLICATIONS

This application is a divisional of U.S. patent application Ser. No. 16/618,710, filed on Sep. 23, 2019, pending, which is a continuation of and which claims priority to PCT/KR2018/006511, filed on Jun. 8, 2018, expired, which claims priority to Korea Patent Application No. 10-2017-0076715, filed on Jun. 16, 2017, and Korea Patent Application No. 10-2017-0076714, filed on Jun. 16, 2017, the entireties of which are incorporated herein by reference.

TECHNICAL FIELD

The present disclosure relates to substrate processing apparatuses, and more particularly, to a substrate processing apparatus capable of improving uniformity through revolution of a main disk and rotation of a sub-disk when a plurality of substrates are processed.

The present disclosure relates to a rotating electrical connector, and more particularly, to a rotating electrical connector for vacuum.

BACKGROUND

[Substrate Processing Apparatus]

In general, a semiconductor memory device, a liquid crystal display, an organic light emitting device, and the like, are manufactured by a manufacturing process in which a semiconductor process is performed twice or more times on a substrate to deposit and stack a structure having a desired shape.

A semiconductor manufacturing process includes a deposition process in which a predetermined thin film is deposited on a substrate, a photolithography process in which a selected region of the thin film is exposed, an etching process in which the thin film of the selected region is removed, and the like. Such a semiconductor process is performed in a process chamber in which an optimal environment is established for a corresponding process.

In general, an apparatus for processing a circular substrate such as a wafer is disposed inside a process chamber, and has a structure in which a plurality of second disks (sub-disks), each having a size smaller than a circular first disk (a main disk), are mounted on the first disk.

In a substrate processing apparatus, substrate process is performed by seating a substrate on the second disk, rotating the first disk and rotating and revolving the second disk, and injecting a source material onto the substrate to deposit and stack a structure having a desired shape on the substrate.

At this point, an additional apparatus for injecting air or another gas is used to rotate the second disk about an axis thereof. In this case, foreign substances contained in the air or gas may be adsorbed to the substrate to cause product defects.

Korean Patent Publication No. 10-2016-0073281 discloses that a metal disk is rotated when s magnet is relatively moved to only a neighboring portion of the metal disk based on Arago's principle. However, the rotation of the metal disc based on the Arago's principle is difficult to control precise rotation speed and to precisely stop the metal disk in a desired location.

Accordingly, there is a need for a rotation method of stably rotating the second disk mounted on the first disk while revolving the first disk. In addition, there is a need for a fixing method of stably fixing the substrate mounted on the second disk against centrifugal force.

[Rotating Electrical Connector]

A slipring is an electrical/mechanical component, also called a rotary connector, and is a type of rotation connector, capable of supplying power or a signal line to a rotating device without twisting of electric wires.

In general, an apparatus for processing a circular substrate such as a wafer is disposed inside a process chamber, and has a structure in which a plurality of second disks (sub-disks), each having a size smaller than a circular first disk (a main disk), are mounted on the first disk.

In a substrate processing apparatus, substrate process is performed by seating a substrate on the second disk, rotating the first disk and rotating and revolving the second disk, and injecting a source material onto the substrate to deposit and stack a structure having a desired shape on the substrate.

At this point, an additional apparatus for injecting air or another gas is used to rotate the second disk about an axis thereof. In this case, foreign substances contained in the air or gas may be adsorbed to the substrate to cause product defects.

When mounting an electrostatic chuck rotating while revolving in a substrate processing apparatus, there is demand for a method of stably transmitting a high voltage in a vacuum state to the electrostatic chuck. In the case in which the electrostatic chuck is a bipolar electrostatic chuck, a conventional slipring cannot be used because parasitic discharge occurs.

SUMMARY

An aspect of the present disclosure is to provide a substrate processing apparatus, capable of stably providing a high DC voltage to a plurality of rotating electrostatic chuck.

An aspect of the present disclosure is to provide a substrate processing apparatus providing a rotation ratio, having an appropriate revolution period and an appropriate rotation period, to a plurality of rotating electrostatic chucks.

An aspect of the present disclosure is to provide a rotating electrical connector performing electrical connection between a rotational motion and a high voltage without parasitic discharge in a vacuum chamber.

According to an aspect of the present disclosure, a substrate processing apparatus includes: a disk including a plurality of electrostatic chucks periodically disposed at a constant radius from a central axis; a disk support supporting the disk; a DC line electrically connected to the plurality of electrostatic chucks through the disk support; and a power supply configured to supply power to the DC line. The DC line includes: a first DC line penetrating through the disk support from the power supply; a power distribution unit configured to distribute the first DC line to connect the first DC line to each of the plurality of electrostatic chucks; and a plurality of second DC lines respectively connected to the plurality of electrostatic chucks in the power distribution unit.

In an example embodiment, the power distribution unit may include: an internal power distribution ring having a plurality of first connection terminals protruding in an external radial direction and charged with a positive voltage and disposed on an upper surface of the disk; and an external power distribution ring having a second connection terminal protruding in an internal radial direction and charged with a negative voltage and disposed on an upper surface of the disk.

In an example embodiment, the internal power distribution ring may have a snap ring shape in which a portion of a radius is cut, the external power distribution ring may have a snap ring shape in which a portion of a radius is cut, and the cut portion of the internal power distribution ring and the external power distribution ring may be disposed to oppose each other. The first DC line may include a first positive DC line and a first negative DC line. The internal power distribution ring may include a first connection portion connecting one end of the first positive DC line and an opposite side of the cut portion of the internal power distribution ring. The external power distribution ring may include a second connection portion connecting one end of the first negative DC line and an opposite side of the cut portion of the external power distribution ring.

A rotating electrical connector for vacuum according to an example embodiment may include a rotator formed of an insulating material and having a cylindrical shape; an upper conductive ring and a lower conductive ring disposed to cover side surfaces of the rotator and spaced apart from each other; and an intermediate insulating barrier disposed between the upper conductive ring and the lower conductive ring. The intermediate insulating barrier may block generation of plasma between the upper conductive ring and the lower conductive ring.

In an example embodiment, the rotating electrical connector for vacuum may further include an upper insulating barrier, disposed above the upper conductive ring, and the lower insulating barrier disposed below the lower conductive ring. The intermediate insulating barrier may protrude further in an external radius direction than the upper insulating barrier and the lower insulating barrier.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

[Substrate Processing Apparatus]

Figure 1:
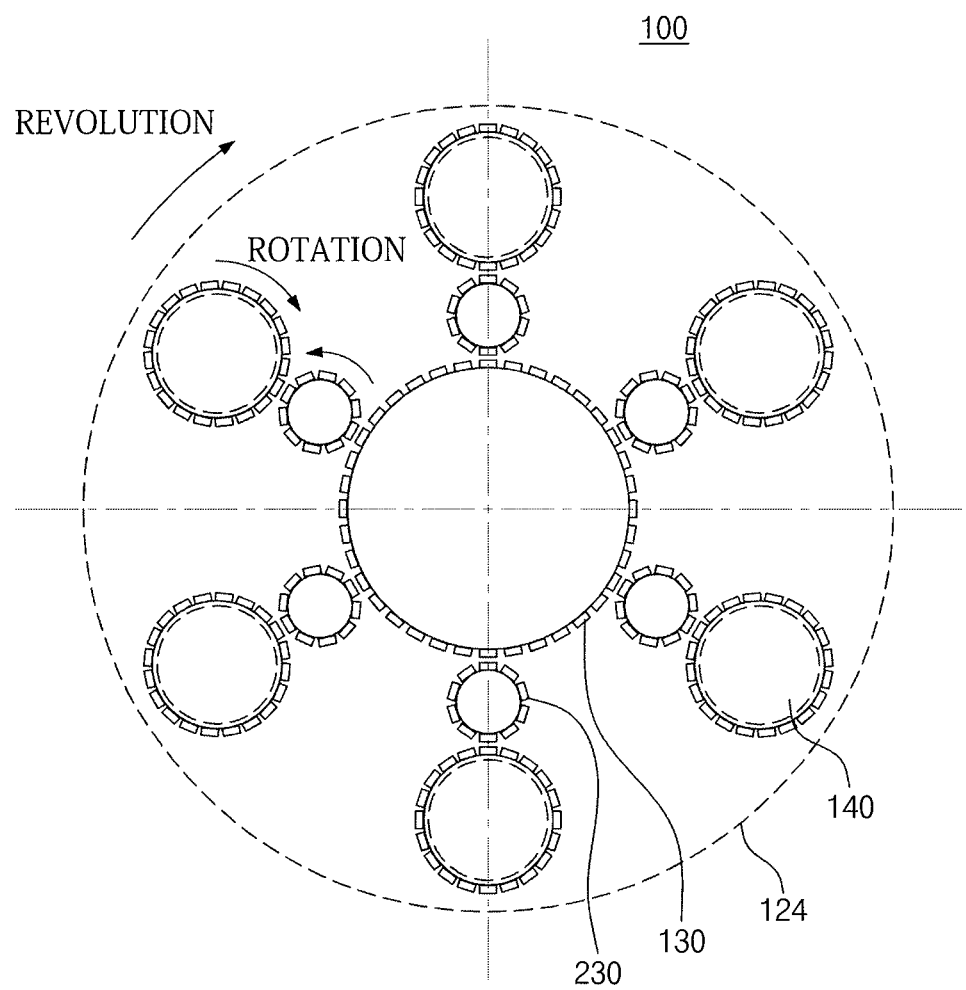
FIG. 1 is a plan view illustrating a magnetic gear of a substrate processing apparatus according to an example embodiment of the present disclosure.

In order to simultaneously process substrates respectively disposed in a plurality of electrostatic chucks rotating in a single chamber, the substrates are required to simultaneously revolve and rotate and to be stably fixed against centrifugal force generated by the revolution and rotational motions.

A mechanical chuck may stably fix a substrate, but the mechanical chuck is difficult to be disposed on a rotating plate (or a second disk) revolving and rotating at the same time in a revolving plate (or a first disk) revolving.

On the other hand, although the electrostatic chuck can stably fix the substrate, it is difficult to perform electrical wiring on a revolving plate (or the first disk) and a rotating plate (or the second disk) which simultaneously revolves and rotates.

According to an example embodiment, a magnetic gear may provide a rotational motion while revolving on the second disk, and an electrostatic chuck is also used to fix the substrate. Electrical wiring is performed between the electrostatic chuck and the rotating first disk using a rotating connector structure. Accordingly, a substrate may be stably fixed and may rotate while revolving, and thus, process uniformity may be ensured. A power distribution unit, disposed on the first disk, may distribute a high DC voltage to a plurality of rotating connector structures. The power distribution unit includes an internal power distribution ring and an external distribution ring disposed on an upper surface of the first disk, and includes a first lower extending portion and a second lower extending portion radially extending from a lower surface of the first disk. In addition, the power distribution unit is coated with an insulating material to have improved insulation property and to be readily decoupled/coupled.

According to an example embodiment, a structure in which rotating plates (second disks or electrostatic chucks) are disposed on a revolving plate (a first disk) is provided, and the rotating plate rotates while revolving according to the revolution of the revolving plate. Accordingly, to rotate the rotating plate, a magnetic gear includes first magnetic gears, second magnetic gears, and third magnetic gears. The first magnetic gear rotates with the rotating plate, and the second magnetic gear is fixed without rotation in a center of a chamber. In order to adjust a rotation ratio of the second magnetic gear and the first magnetic gear, the third magnetic gear is disposed between each of the first magnetic gears and the first magnetic gear and is disposed to be rotationally fixed the first disk. The second magnetic gear is fixed in the center of the chamber without rotating, and the first magnetic gear is coupled to the rotating plate to rotate with the rotating plate.

According to an example embodiment, when a height of the first disk is changed to change a placement plane of the substrate, heights of the first magnetic gear and the third magnetic gear are changed. Accordingly, in order to operate the magnetic gear, a placement plane of the second magnetic gear may be adjusted to be the same as a placement plane of each of the first magnetic gear and the third magnetic gear.

In order to use an electrostatic chuck, the second disk and the first disk are required to be electrically connected. To this end, the revolving plate (the first disk) and the rotating plate (the second disk) are wired using a first rotating connector structure (or a slipring), and the revolving plate (the first disk) is connected to external power through a second rotating connector structure.

The first disk may include a power distribution unit for electrical wiring in the electrostatic chucks. The power distribution unit may have a ring shape and may be disposed on an upper surface of the first disk to provide efficient wiring.

Additionally, a placement plane of the substrate may be changed to change process conditions. In this case, the placement plane of the revolving plate (the first disk) may be changed using a bellows structure.

Hereinafter, embodiments will be described in detail with reference to the accompanying drawings. While the disclosure is subject to various modifications and alternative forms, specific embodiments thereof are shown by way of example in the drawings and are explained in detail in the description. However, the disclosure should not be construed as being limited to the embodiments set forth herein, but on the contrary, the disclosure is intended to cover all modifications, equivalents, and alternatives falling within the spirit and scope of the embodiments. In the drawings, the sizes or shapes of elements may be exaggerated for convenience and clarity of description.

It may be understood that, although the terms "first," "second," etc. may be used herein to describe various elements, these elements are not to be construed as being limited by these terms. These terms are generally only used to distinguish one element from another. In addition, terms particularly defined in consideration of the construction and operation of the embodiments are used only to describe the embodiments, but do not define the scope of the embodiments.

It will be understood that when an element is referred to as being "on" or "under" another element, it can be directly on/under the element, or one or more intervening elements may also be present. When an element is referred to as being "on" or "under," "under the element" as well as "on the element" can be included based on the element.

In addition, relational terms, such as "on/upper part/above" and "under/lower part/below," are used only to distinguish between one subject or element and another subject or element, without necessarily requiring or involving any physical or logical relationship or sequence between the subjects or elements.

FIG. 1 is a plan view illustrating a magnetic gear of a substrate processing apparatus according to an example embodiment of the present disclosure.

Figure 2:
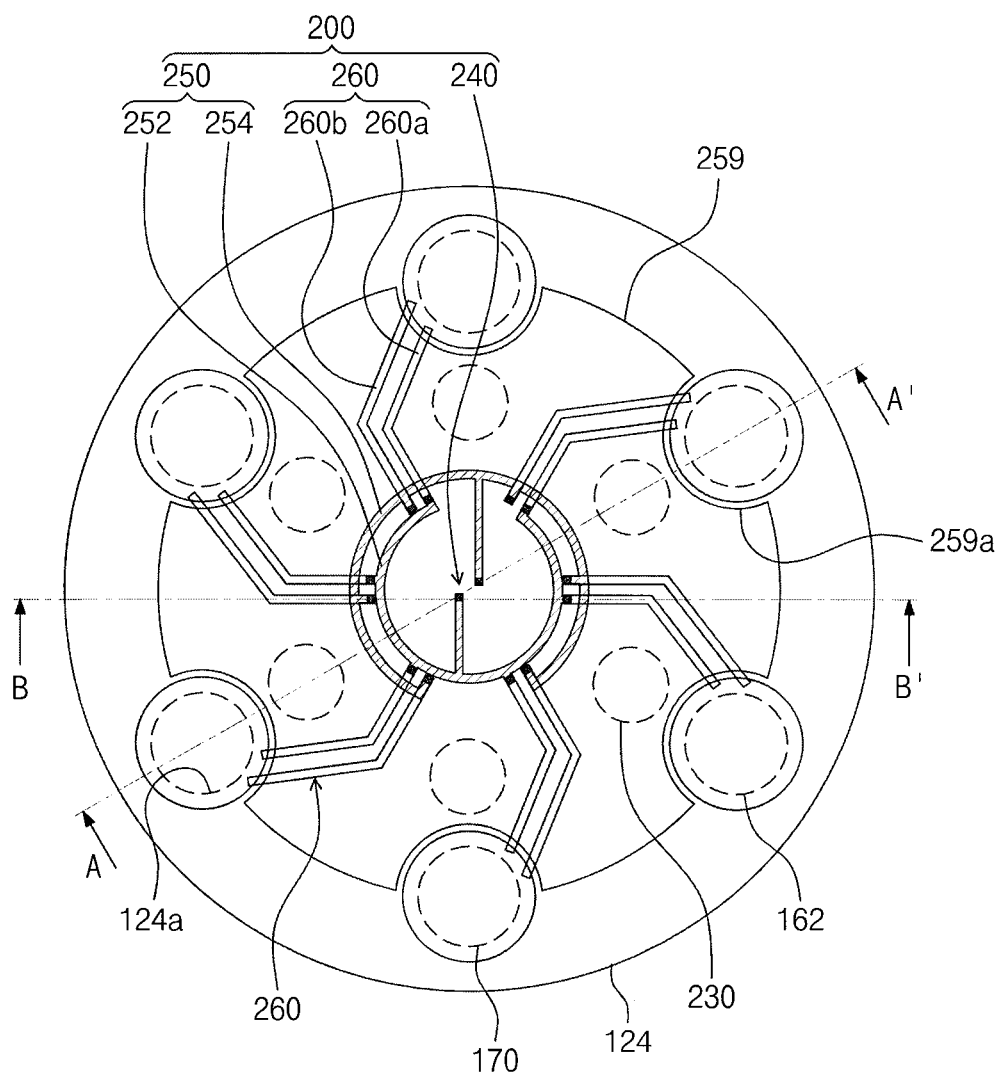
FIG. 2 is a plan view illustrating a power distribution unit of the substrate processing apparatus in FIG. 1.

FIG. 2 is a plan view illustrating a power distribution unit of the substrate processing apparatus in FIG. 1.

Figure 3:
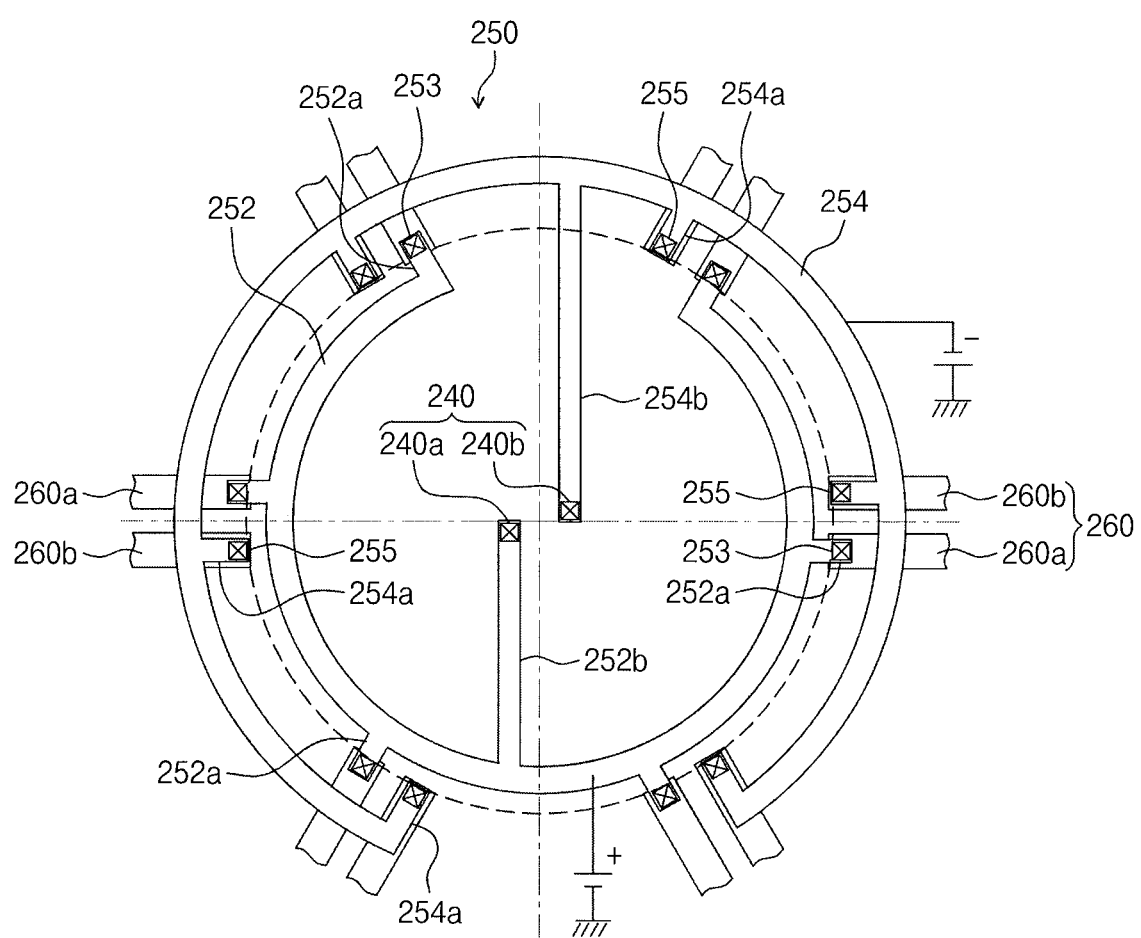
FIG. 3 is an enlarged plan view of the power distribution unit of the substrate processing apparatus in FIG. 2.

FIG. 3 is an enlarged plan view of the power distribution unit of the substrate processing apparatus in FIG. 2.

Figure 4:
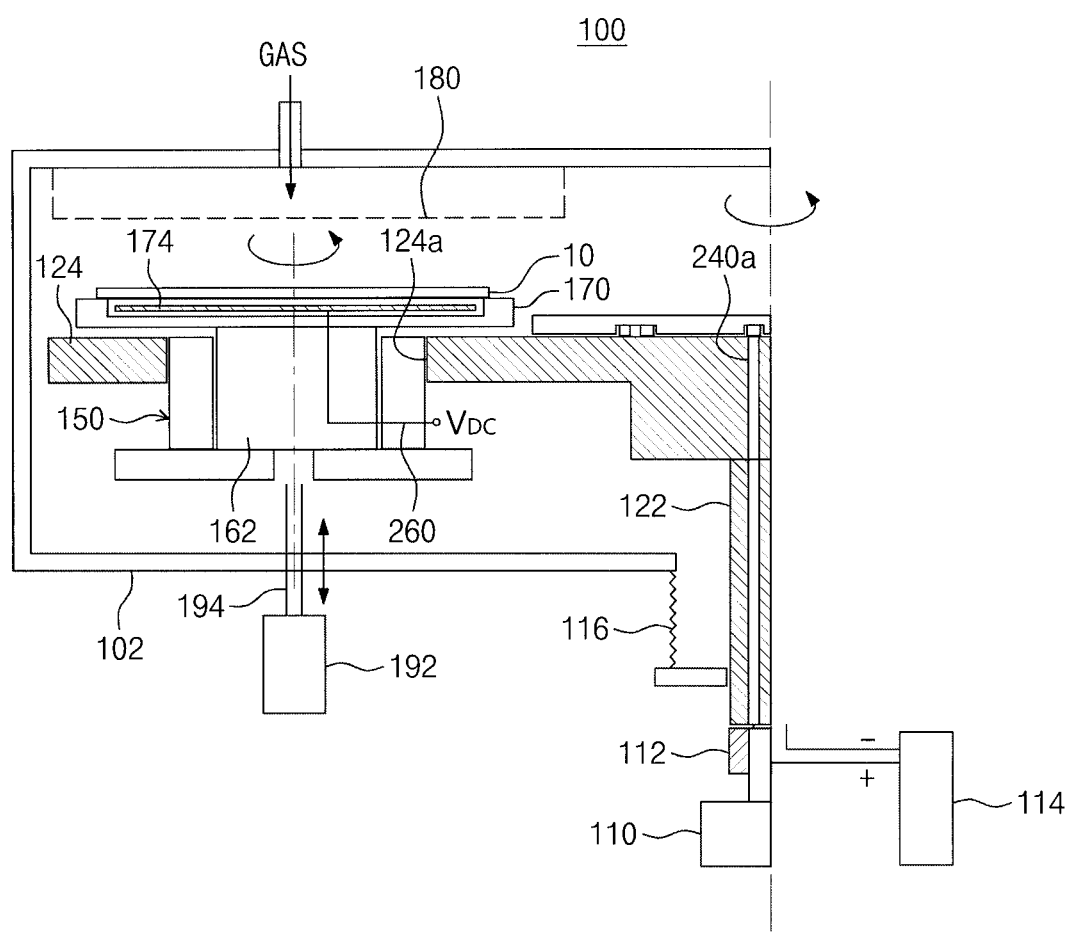
FIG. 4 is a cross-sectional view taken along line A-A' in FIG. 2.

FIG. 4 is a cross-sectional view taken along line A-A' in FIG. 2.

Figure 5:
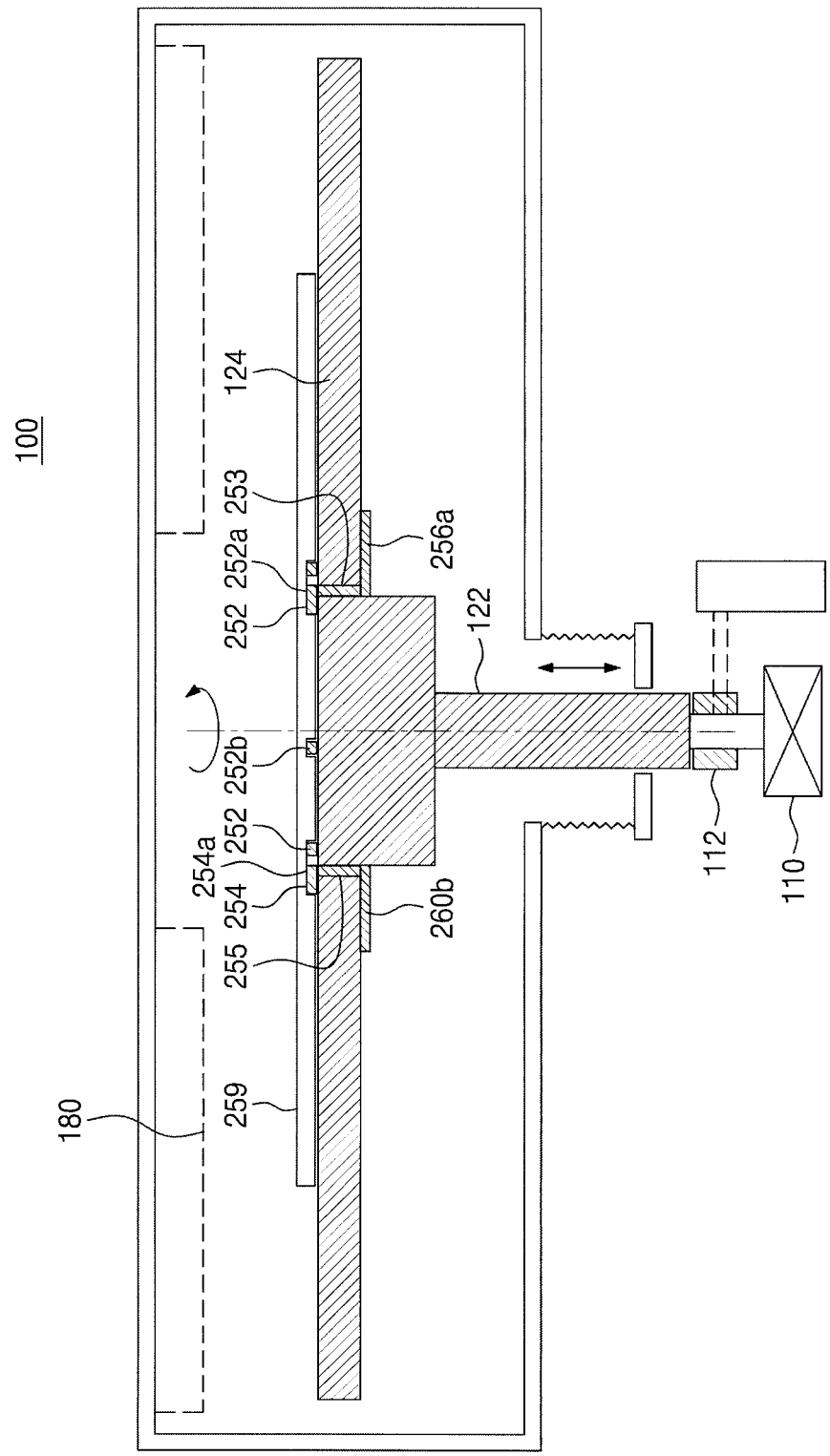
FIG. 5 is a cross-sectional view taken along line B-B' in FIG. 2.

FIG. 5 is a cross-sectional view taken along line B-B' in FIG. 2.

Figure 6:
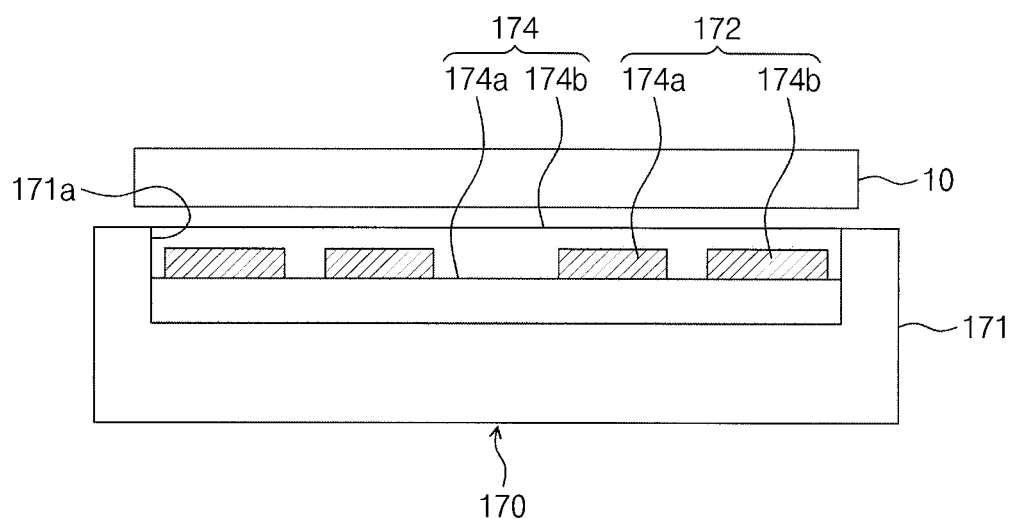
FIG. 6 is a cross-sectional view of an electrostatic chuck according to an example embodiment of the present disclosure.

FIG. 6 is a cross-sectional view of an electrostatic chuck according to an example embodiment of the present disclosure.

Referring to FIGS. 1 to 6, a substrate processing apparatus 100 according to an example embodiment includes a disk 124 including a plurality of electrostatic chucks 170 periodically disposed at a constant radius from a central axis, a disk support 122 supporting the disk 124, a DC line 200 electrically connected to the plurality of electrostatic chucks 170 through the disk support 122, and a power supply 114 configured to supply power to the DC line 200. The DC line 200 may include a first DC line 240 penetrating through the disk support 122 from the power supply 114, a power distribution unit 250 configured to distribute the first DC line 240 to connect the first DC line 240 to each of the plurality of electrostatic chucks 170, and a plurality of second DC lines 260 respectively connected to the plurality of electrostatic chucks 170 in the power distribution unit 250.

The chamber 102 may be a cylindrical chamber. The chamber 102 may perform a thin film deposition process or a substrate surface treatment process. A gas distribution unit 180 may be disposed on an internal upper surface of the chamber 102. The gas distribution unit 180 may have a toroidal shape having a rectangular section. A lower surface of the gas distribution unit 180 may include a plurality of gas injection holes through which a gas may be injected to the substrate 10 to perform a deposition process. The electrostatic chucks 170 may be periodically disposed on the lower surface of the gas distribution unit 180 at a constant radius.

The disk 124 may be a circular plate. The disk 124 may rotate about a central axis thereof. The disk 124 may include a plurality of seating holes 124a disposed on a circumference having a constant radius at regular intervals. The number of the seating holes 124a may be six. A power distribution unit 250 may be disposed on an upper surface of the disk 124.

The rotating plate 162 may be inserted into the seating hole 124a or the first rotating connector structure 150. The rotating plate 162 may revolve with the rotation of the disk 124. The rotating plate 162 may rotate while revolving through magnetic gears 140, 130, and 230. Angular speed of the rotation may be determined by a gear ratio of the magnetic gear. The rotating plate 162 may be in the form of a disk, and may be formed of a material such as a metal, graphite, quartz, or the like. The rotating plate 162 may support the electrostatic chuck 170 and may be coupled to the first magnetic gear 140.

The first rotating connector structure 150 may be disposed to cover the rotating plate 162 and may be inserted into the seating hole 124a. The first rotating connector structure 150 has an upper bearing and a lower bearing vertically spaced apart from each other, a slipring body disposed between the upper bearing and the lower bearing, and at least one slipring disposed on an external circumferential surface of the slipring body, and a brush electrically connected to the slipring. The first rotating connector structure 150 will be described in detail later as a rotating electrical connector for vacuum.

An upper surface of the upper bearing may be substantially the same as an upper surface of the disk 124, and a lower surface of the lower bearing may be substantially the same as a lower surface of the rotating plate 162. Each of the upper bearing and the lower bearing may have a toroidal shape. The slipring body may have a toroidal shape, may be disposed between the upper bearing and the lower bearing, and may be rotatable and electrically insulated or formed of an insulating material. The slipring may be disposed to be exposed to an external circumferential surface of the slipring body to be electrically connected to the brush. The brush may be in electrical contact with the rotating slipring 151 using elasticity to provide an electrical connection.

The electrostatic chuck 170 may be disposed on an upper surface of the rotating plate 162. The electrostatic chuck 170 may receive power from a lead line extending through a lead line path formed in the rotating plate 162. The electrostatic chuck 170 may have a lead line path, and the conductive wire passing through the lead line path may perform electrical connection with an electrostatic electrode.

The electrostatic chuck 170 may include an electrostatic chuck body 171, an electrode seating portion 171a recessed in an upper surface of the electrostatic chuck body 171, an insulating member 174 filling the electrode seating portion 171a, and a pair of electrostatic electrodes 172 embedded in the insulating member 174. The electrostatic chuck 170 may operate as a bipolar electrostatic chuck. A lower surface of the electrostatic chuck 170 may be higher than an upper surface of the disk 124. The electrode seating portion 171a may have a disk shape, and an upper surface of the electrode body 171 and an upper surface of the insulating member 174 may be substantially the same. The insulating member 174 may be disposed to cover the pair of electrostatic electrodes 172. A thickness of a lower insulating member 174b, disposed on the lower surface of the electrostatic electrode 172, may be greater than a thickness of an upper insulating member 174a disposed on the upper surface of the electrostatic electrode 172. The lower insulating member 174b may be formed on the electrostatic chuck body 171 through thermal spray coating, and may be coated by printing the electrostatic electrode. After the electrostatic electrode is patterned, the upper insulating member may be formed through thermal spray coating. The insulating member 174 may supply Coulomb-type electrostatic force or Johnsen-Rahbek type electrostatic force depending on resistivity. Each of the pair of electrostatic electrodes 172a and 172b may have a washer shape of concentric structure. The second electrostatic electrode 172b may cover the first electrostatic electrode 172a with the concentric structure, and the pair of electrostatic electrodes 172a and 172b may be disposed on the same plane.

The electrostatic electrode 172 may include a first electrostatic electrode 172a and a second electrostatic electrode 172b having a concentric structure, and a high DC voltage may be applied between the first electrostatic electrode 172a and the second electrostatic electrode 172b. Accordingly, the substrate disposed on the electrostatic chuck 172 may be fixed by electrostatic suction force.

The disk support 122 may extend from a central axis of the disk in a direction of a lower surface of the chamber 102. The disk support 122 may have a cylindrical shape, and the disk support 122 may have a lead line path in which a lead line may be disposed. The first DC line 240 may be disposed in the conductive path. The disk support 122 may be fixedly coupled to the disk 124.

The second rotating connector structure 112 may be axially coupled to one end of the disk support 122 penetrating through the bellows structure 116 and may provide an electrical connection while providing a rotational motion. The second rotating connector structure 112 may perform substantially the same function as the first rotating connector structure 150. The second rotating connector structure 112 may be a slipring. A brush may be connected to the power supply 114, and may supply power to the first DC line 240 disposed in the lead line path extending along the disk support 122 operating through the second rotating connector structure. The power may be supplied to the electrostatic chuck 170 through the DC line 200 and the first rotating connector structure 150. The power supply 114 may output a positive DC voltage and a negative DC voltage.

A rotation driving unit 110 may be coupled to one end of the disk support 112 to rotate the disk support 122. The rotation driving unit 110 may be a motor. According to elasticity of the bellows structure 116, the rotation driving unit 110, the second rotating connector structure 112, the disk support 122, and the disk 124 may vertically move.

First magnetic gears 140 may be respectively fixed to lower surfaces of the rotating plates 162 to provide rotational force to the rotating plate 162 and the electrostatic chuck 170. The second magnetic gear 130 may be disposed below the disk 124 to be fixed to the chamber 102. Third magnetic gears 230 may be rotatably fixed to the lower surface of the disk and may be respectively disposed between the first magnetic gears 140 and the second magnetic gear 130 to adjust a rotation ratio. As the disk 124 revolves, the first magnetic gears 140 and the third magnetic gears 230 may rotate.

Each of the electrostatic chuck 170 and the rotating plate 162 may have at least three vertical through-holes. The vertical through-holes may be vertically aligned with each other in the electrostatic chuck 170 and the rotating plate 162. When the disk and the rotating plate are stopped, a lift pin 194 lifting the substrate may be inserted through the vertical through-hole. The lift pin 194 may be vertically and linearly moved by a lift pin driving unit 192.

The DC line includes a first DC line 240 penetrating through the disk support 122 at the power supply 114, a power distribution unit 250 configured to distribute the first DC line 240 to connect the first DC line 240 to each of the plurality of electrostatic chucks 170, and a plurality of second DC lines 260 connected to each of the plurality of electrostatic chucks 170 at the power distribution unit 250. The DC line 200 may be coated with an insulating material. A component, constituting the DC line 200, may be aluminum and may be anodized to coated with an insulating material.

The power distribution unit may include an internal power distribution ring, having a plurality of first connection terminals protruding in an external radial direction and charged with a positive voltage and disposed on an upper surface of the disk, and an external power distribution ring having a second connection terminal protruding in an internal radial direction and charged with a negative voltage and disposed on an upper surface of the disk.

The internal power distribution ring may have a snap ring shape in which a portion of a radius is cut, and the external power distribution ring has a snap ring shape in which a portion of a radius is cut. The cut portion of the internal power distribution ring and the external power distribution ring may be disposed to oppose each other.

The first DC line may include a first positive DC line and a first negative DC line. The internal power distribution ring may include a first connection portion connecting one end of the first positive DC line and an opposite side of the cut portion of the internal power distribution ring. The external power distribution ring may include a second connection portion connecting one end of the first negative DC line and an opposite side of the cut portion of the external power distribution ring.

The power distribution unit may further include: a first contact plug connected to the first connection terminal and extending through the disk; and a second contact plug connected to the second connection terminal and extending through the disk.

The second DC line may include a second positive DC line and a second negative DC line. One end of the second positive DC line may be connected to the first contact plug, and the second positive DC line may extend from a lower surface of the disk. One end of the second negative DC line may be connected to the second contact plug, and the second negative DC line may extend from the lower surface of the disk. Each of the second positive DC line and the second negative DC line may be bent to have a "V" shape.

The second positive DC line and the second negative DC line may be connected to the first rotating connector structure. The first contact plug and the second contact plug may be disposed to form a pair on a constant radius.

A first positive DC line 240a and a first negative DC line 240b may be disposed side by side through the disk 124 and the disk support 122. The first positive DC line 240a may be connected to a positive DC voltage, and the first negative DC line 240b may be connected to a negative DC voltage. Each of the first positive DC line 240a and the first negative DC line 240b may be formed of aluminum and may have a cylindrical shape. The first positive DC line 240a and the first negative DC line 240b may be coated with an insulating material to be insulated.

An internal power distribution ring 252 may be electrically connected to the first positive DC line 240a and may be disposed on an upper surface of the disk 124. The internal power distribution ring 252 may be coated with an insulating material to be insulated. The internal power distribution ring 252 may have a snap ring shape in which a portion of a radius is cut. The internal power distribution ring 252 may include a first connection portion 252b connecting one end of the first positive DC line 240a to an opposite side of the cut portion of the internal power distribution ring. A central axis of the internal power distribution ring may be substantially aligned with the first positive DC line.

The internal power distribution ring 252 may be in the form of a strip having a predetermined thickness. The internal power distribution ring 252 may be coated with an insulating material to be insulated. The internal power distribution ring 252 may include a plurality of first connection terminals 252a disposed on a circumference at regular intervals to protrude outwardly.

An external power distribution ring 254 may be electrically connected to the first negative DC line 240b and may be disposed on the upper surface of the disk 124. The external power distribution ring 254 may be disposed to cover the internal power distribution ring 252 and may have the same central axis. The external power distribution ring 254 may have a snap ring shape in which a portion of a radius is cut. The cut portion of the internal power distribution ring and the cut portion of the external power distribution ring may be disposed to oppose each other. The external power distribution ring 254 may include a second connection portion 254b connecting one end of the first negative DC line to an opposite side of the cut portion of the external power distribution ring. The external power distribution ring 254 may be in the form of a strip having a predetermined thickness. The external power distribution ring may be coated with an insulating material to be insulated. The external power distribution ring 254 may include a plurality of second connection terminals 254a disposed on the circumference at regular intervals to protrude inwardly.

The first contact plug 253 may be electrically connected to the first connection terminal 252a and may extend to the lower surface of the disk 124 through the disk 124. The first contact plug 253 may be formed of a conductive material, and an external circumferential surface thereof may be coated with an insulating material to be insulated.

The second contact plug 255 may be electrically connected to the second connection terminal 254a and may extend to the lower surface of the disk 124 through the disk 124. The second contact plug 255 may be formed of a conductive material, and an external circumferential surface thereof may be coated with an insulating material to be insulated. The first contact plug and the second contact plug may be disposed adjacent to each other to form a pair. The first contact plugs and the second contact plugs may be alternately disposed on a constant radius.

The second DC line 260 may include a second positive DC line 260a and a second negative DC line 260b. The second positive DC line 260a may extend from the lower surface of the disk and may be electrically connected to the first contact plug 253. The second negative DC line 260b may extend from the lower surface of the disk and may be electrically connected to the second contact plug 255. Each of the second positive DC line 260a and the second negative DC line 260b may be bent to have a "V" shape. The second positive DC line 260a and the second negative DC line 260b extend parallel to each other and are connected to the brush of the first rotating connector structure 150. Accordingly, the electrostatic chuck may be supplied with a positive voltage and a negative voltage.

An upper cover 259 may be disposed on the disk and may be disposed to cover the internal power distribution ring 252 and the external power distribution ring 254. The upper cover 259 may have a disk shape and may be a cut portion 259a recessed in a location, where the electrostatic chucks are disposed, to have a semicircular shape. The upper cover 259 may be formed of a dielectric material. A washer-shaped recessed portion, not illustrated, may be disposed on a lower surface of the upper cover, and the internal power distribution ring 252 and the external power distribution ring 254 may be disposed on the recessed portion. The recessed portion may be continuously connected to a pair of trenches extending to face each other in a central direction thereof. The pair of trenches may be disposed to cover the first connection portion 252b and the second connection portion 254b.

[Rotating Electrical Connector]

A rotating electrical connector according to an example embodiment may provide an electrical connection to an electrostatic chuck while rotating the electrostatic chuck. When the rotating electrical connector is disposed inside a vacuum chamber, it may include brushes disposed to oppose each other to suppress parasitic DC plasma discharge. The rotating electrical connector may be a slipring and may suppress parasitic discharge between a positive electrode ring and a negative electrode ring.

According to an example embodiment, even when a positive/negative high voltage is applied to the rotating electrical connector, a process window may be expanded by changing locations of an insulating barrier and the brushes such that DC plasma discharge does not occur and hardware stability may be secured.

A conventional slipring is used at atmospheric pressure, but cannot be used in a vacuum chamber due to occurrence of DC discharge when the inside of the vacuum chamber is in a high vacuum state.

According to an example embodiment, in order to apply a high voltage to an electrostatic chuck mounted on a rotating electrical connector, a structure of an insulating barrier of the rotating electrical connector and a location and a structure of a brush of the rotating electrical connector are changed to suppress parasitic discharge. Thus, when a process is performed in the vacuum chamber, an issue such as occurrence of gas leakage, caused by parasitic DC discharge, may be addressed.

A rotating electrical connector according to an example embodiment may increase a discharge path between a pair of electrode rings to suppress parasitic discharge. In addition, by changing a structure of an insulating barrier into a structure having a raised spot, a parasitic discharge path may be increased to suppress parasitic discharge.

A rotating electrical connector according to an example embodiment may suppress parasitic discharge while applying a high voltage to an electrostatic chuck and may operate the electrostatic chuck at the high voltage to increase substrate suction force. Thus, the rotating electrical connector may increase revolving and rotating speeds of the electrostatic chuck to improve process uniformity and an etching rate.

In addition, the rotating electrical connector may suppress the parasitic discharge to control leakage occurring when a substrate is chucked. In addition, sliding of the substrate, caused by the leakage, may be addressed. In addition, occurrence of parasitic discharge or arc may be prevented to reduce maintenance costs.

Figure 7:
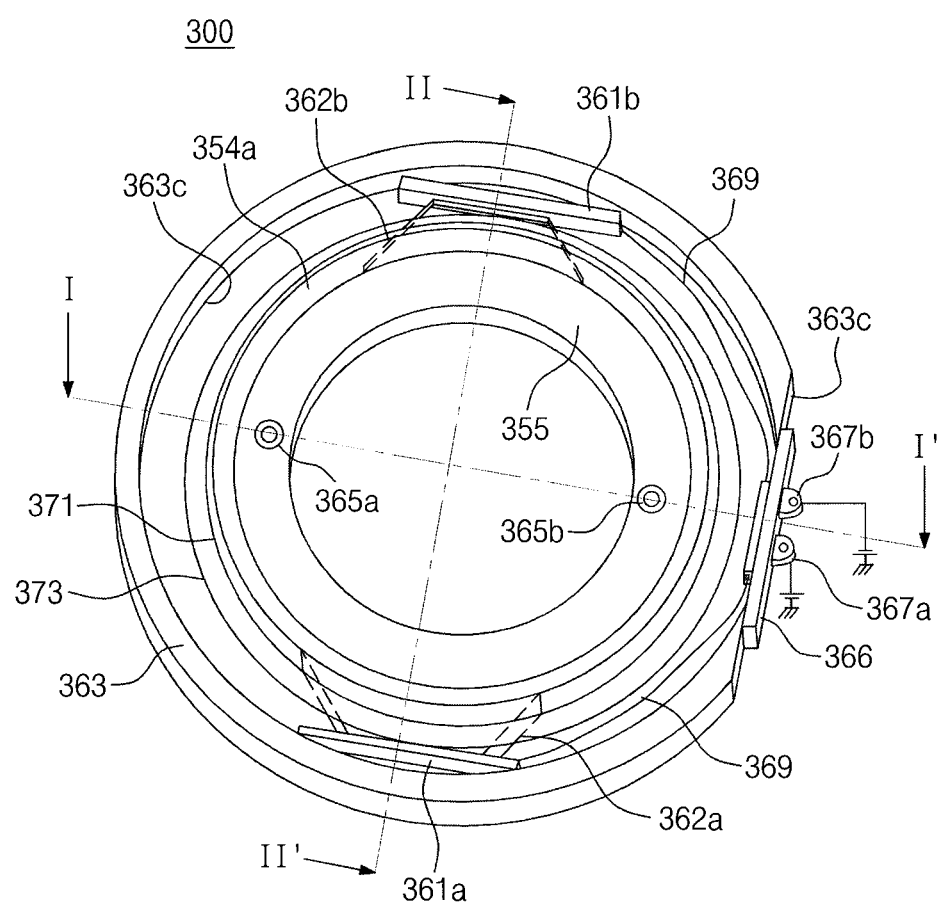
FIG. 7 is a perspective view of a rotating electrical connector for vacuum with a cover removed, according to an example embodiment of the present disclosure.

FIG. 7 is a perspective view of a rotating electrical connector for vacuum with a cover removed, according to an example embodiment of the present disclosure.

Figure 8:
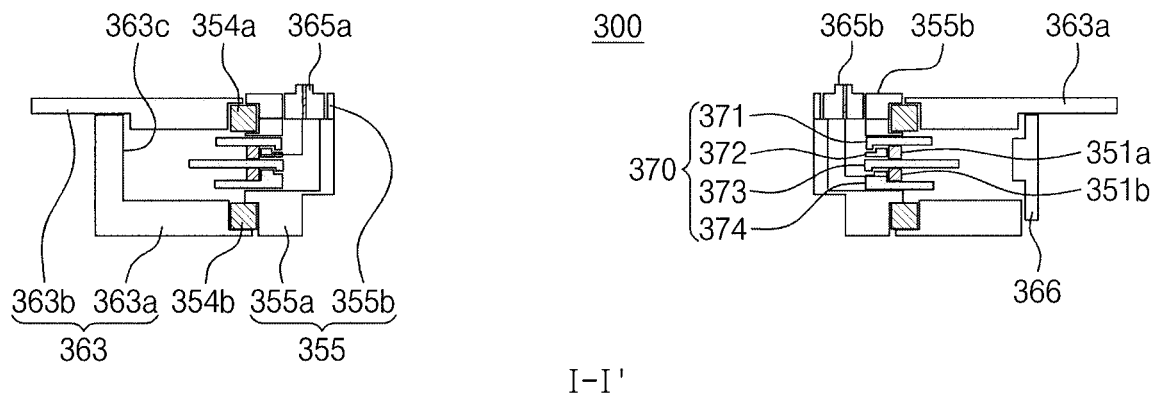
FIG. 8 is a cross-sectional view taken along line I-I' in FIG. 7.

FIG. 8 is a cross-sectional view taken along line I-I' in FIG. 7.

Figure 9:
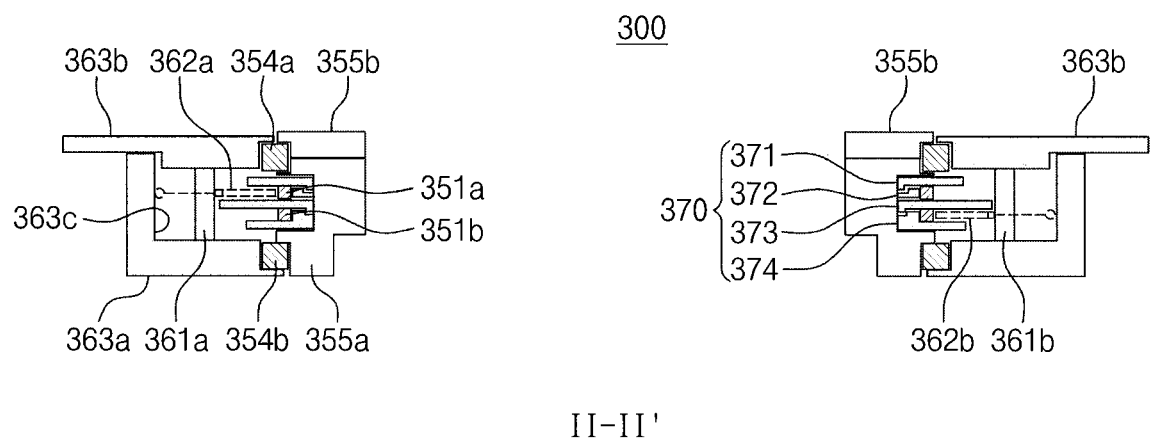
FIG. 9 is a cross-sectional view taken along line B-B' in FIG. 7.

FIG. 9 is a cross-sectional view taken along line B-B' in FIG. 7.

Figure 10:
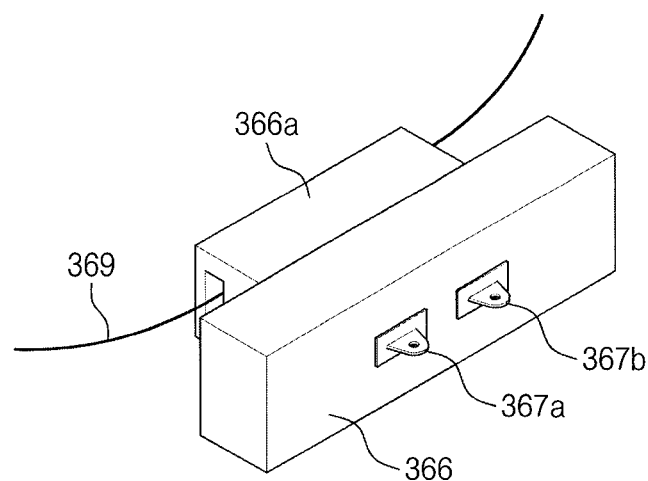
FIG. 10 is a perspective view of an input connector insulating block of the rotating electrical connector in FIG. 7.

FIG. 10 is a perspective view of an input connector insulating block of the rotating electrical connector in FIG. 7.

Figure 11:
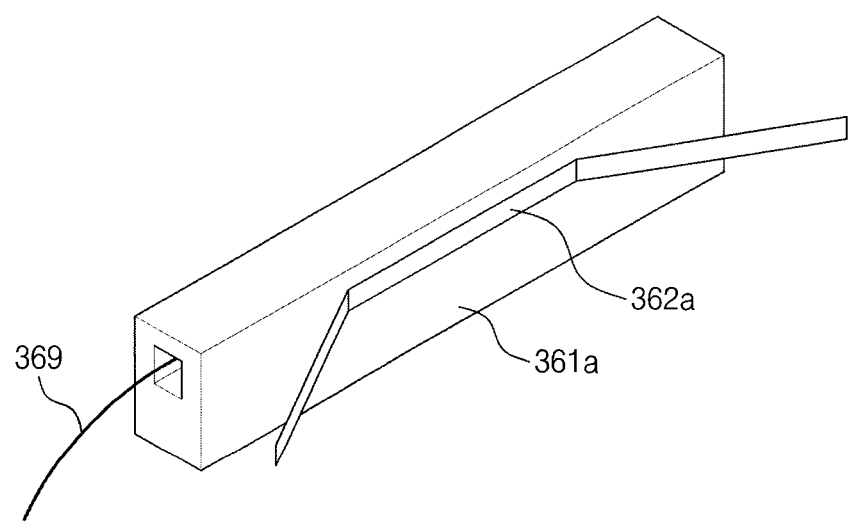
FIG. 11 is a perspective view of a brush in FIG. 7.

FIG. 11 is a perspective view of a brush in FIG. 7.

Referring to FIGS. 7 to 11, a rotating electrical connector for vacuum 300 includes a rotator 355 formed of an insulating material and having a cylindrical shape, an upper conductive ring 351a and a lower conductive ring 351b disposed to cover side surfaces of the rotator 355 and spaced apart from each other; and an intermediate insulating barrier 373 disposed between the upper conductive ring 351a and the lower conductive ring 351b. The intermediate insulating barrier 373 blocks generation of plasma between the upper conductive ring 351a and the lower conductive ring 351b.

The upper insulating barrier 371 is disposed above the upper conductive ring 351a, and the lower insulating barrier 374 is disposed below the lower conductive ring 35 lb. The intermediate insulating barrier 373 protrudes further in an external radius direction than the upper insulating barrier 371 and the lower insulating barrier 374.

The upper bearing 354a is disposed on an upper side surface of the rotator 355, and the lower bearing 354b is vertically aligned with the upper bearing 354a and is disposed on a lower side surface of the rotator 355.

A stator 363 is disposed to be in contact with the upper bearing and the lower bearing and to cover the upper insulating barrier 371, the lower insulating barrier 374, and the intermediate insulating barrier 373.

The rotator 355 may be rotated by the upper bearing 354a and the lower bearing 354b. The rotator 355 may basically have a cylindrical shape. An electrostatic chuck or a support portion for supporting the electrostatic chuck may be disposed in the rotator 355. The rotator 355 may be formed of an insulating material, in detail, engineering plastic. A ring-shaped recessed portion may be disposed on an external sidewall of the rotator 355, and the upper insulating barrier 371, the intermediate insulating barrier 373, and the lower insulating barrier 374 may be inserted into the recessed portion to be aligned with each other and fixed to each other. As the rotator 355 rotates while mounting the upper bearing 354a and the lower bearing 354b thereon, the upper conductive ring 351a and the lower conductive ring 351b may rotate together.

An upper external surface of a rotator body 355a is provided with an upper raised portion, the upper bearing 354a may be inserted into the upper raised portion. A lower external surface of the rotator body 355a may have a lower raised portion and the lower bearing 354b may be inserted into the lower raised portion. A first output connector 365a may be connected to the upper conductive ring 351a through a conductive wire, and a second output connector 365b may be connected to the lower conductive ring 35 lb through a conductive wire. The first output connector 365a may provide a positive high voltage to an electrostatic chuck, and the second output connector 365b may provide a negative high voltage to the electrostatic chuck.

Each of the upper conductive ring 351a and the lower conductive ring 351b may be formed of a conductive material and may have a ring shape. The upper conductive ring 351a may be applied with a positive high voltage, and the lower conductive ring 351b may be applied with a negative high voltage. The upper conductive ring 351a and the lower conductive ring 351b may be insulated by the intermediate insulating barrier 373. Since the upper conductive ring 351a and the lower conductive ring 351b are directly exposed to a vacuum state, parasitic discharge may occur when the intermediate insulating barrier 373 does not sufficiently block an electric field. Accordingly, the intermediate insulating barrier 373 may sufficiently extend in the external radius direction. As a result, parasitic discharge may be blocked by increasing a parasitic discharge path between the upper conductive ring 351a and the lower conductive ring 351b in an exposed portion. The parasitic discharge is reduced as a discharge path is increased, and is reduced as a discharge space is decreased.

An insulating barrier 370 may protrude in the external radius direction to increase an external parasitic discharge path between the upper conductive ring 351a and the lower conductive ring 35 lb. In addition, the insulating barrier 370 may be disposed to cover internal surfaces of the upper conductive ring 351a and the lower conductive ring 351b such that an internal parasitic discharge path between the upper conductive ring 351a and the lower conductive ring 351b is increased, and may provide a serpentine parasitic discharge path.

The intermediate insulating barrier 373 may be formed of an insulating material with a sufficiently high breakdown voltage. The intermediate insulating barrier 373 may have a circular washer shape. An external diameter of the intermediate insulating barrier 373 may be greater than an external diameter of each of the upper insulating barrier 371 and the lower insulating barrier 374. An internal radius of the intermediate insulating barrier 373 may be substantially the same as an internal radius of each of the upper insulating barrier 371 and the lower insulating barrier 374.

Each of the upper insulating barrier 371 and the lower insulating barrier 374 may have a circular washer shape. The upper insulating barrier 371 or the intermediate insulating barrier 373 may protrude to be in contact with an internal side surface of the upper conductive ring 351a. The lower insulating barrier 374 or the intermediate insulating barrier 373 may protrude to be in contact with an internal surface of the lower conductive ring 35 lb. Accordingly, the internal side surface of the upper conductive ring 351a may be additionally insulated by the upper insulating barrier 371 or the intermediate insulating barrier 373, and the internal side surface of the lower conductive ring 351b may be additionally insulated by the lower insulating barrier 374 or the intermediate insulating barrier 373. As a result, the parasitic discharge path between the upper conductive ring 351a and the lower conductive ring 351b may be blocked. In addition, the parasitic discharge path between the upper conductive ring 351a and the lower conductive ring 351b may be increased to block parasitic discharge.

An internal side surface of the insulating barrier 371 may protrude in a direction of the intermediate insulating barrier 373. An internal side surface of the intermediate insulating barrier 373 may protrude in a direction of the lower insulating barrier 374. An internal upper surface of the lower insulating barrier 374 may protrude in a direction of the intermediate insulating barrier 373 to be coupled to a protruding portion of the intermediate insulating barrier 373 with a raised portion. An upper auxiliary insulating barrier 372 may be disposed between the upper insulating barrier 371 and the intermediate insulating barrier 373. The upper auxiliary insulating barrier 372 may be coupled to the protruding portion with the raised portion of the upper insulating barrier 371. The upper auxiliary insulating barrier 372 may be coupled to an internal side surface of the upper conductive ring 351a. A structure of the insulating barrier may make a discharge path serpentine to suppress the parasitic discharge.

The stator 363 may have a cylindrical shape, and may have a cutting surface 363c formed by vertically cutting a portion of a side surface 363 of the stator 363. An input connector insulation block 366 may extend in a length direction and may be disposed along the cutting surface 363c. Each of a first input terminal 367a and a second input terminal 367b may be spaced apart from the input connector insulating block 366. The first input terminal 367a may receive a positive high voltage, and the second input terminal 367b may receive a negative high voltage. The input connector insulating block 366 may protrude to an internal space 363c.

A protruding portion 366a of the input connector insulating block 366 may have a hole formed in a length direction therein. A lead line 369, running along the hole, may perform electrical wiring. The lead line 369 may be coated with an insulating material.

A first insulating brush support portion 361a may be disposed in a toroidal internal space 363c of the stator 363. The first insulating brush support portion 361a may have a right prismatic shape. The first insulating brush support portion 361a may be fitted in the internal space 363c to be fixed. An upper brush 362a may be fixed to the first insulating brush support portion 361a and may be in electrical contact with the upper conductive ring 351a. The upper brush 362a may be formed of an elastic conductive wire or a slip, and may have a "U" shape.

A second insulating brush support portion 361b may be disposed in the internal space 363c of the stator 363 and may be disposed to face the first insulating brush support portion 361a. The second insulating brush support portion 361b may have the same shape as the first insulating brush support portion 361a.

A lower brush 362b may be fixed to the second insulating brush support portion 361b and may be in electrical contact with the lower conductive ring 361b. The lower brush 362b may have the same shape as the upper brush 362a. However, the lower brush 362b may be fixed to a lower end of the second insulating brush support portion 361b to be in electrical contact with the lower conductive ring 361b. Each of the upper brush 362a and the lower brush 362b may be formed of a conductive wire having elasticity or a slip and may have a "U" shape.

The lower brush 362b may be disposed so as not to overlap the upper brush 362a about a central axis of the stator 363 in an azimuthal direction. In detail, the lower brush 362b may be disposed to face the upper brush 362a at an angle of 180 degrees. Accordingly, the lower brush 362b and the upper brush 362a may mutually suppress parasitic discharges.

The first insulating brush support portion 361a and the input connector insulating block 366 may be disposed at a difference of 90 degrees with respect to the central axis of the stator 363. The first output terminal 365a and the second output terminal 365b may be disposed at a difference of 180 degrees with respect to the central axis of the rotator 355. The upper brush 362a may be connected to the first input terminal 367a through a wire 369, and the lower brush 362b may be connected to the second input terminal 367b through a wire. In order to suppress parasitic discharge between the upper brush 362a and the lower conductive ring, the intermediate insulating barrier 373 may be disposed to have a minimum tolerance with the upper brush support portion 361a.

Figure 12:
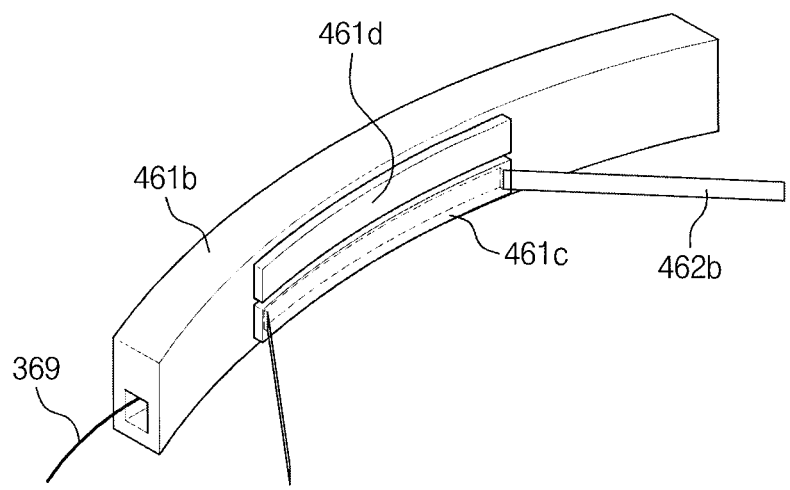
FIG. 12 is a perspective view of a brush support part according to another example embodiment of the present disclosure.

FIG. 12 is a perspective view of a brush support part according to another example embodiment of the present disclosure.

Figure 13:
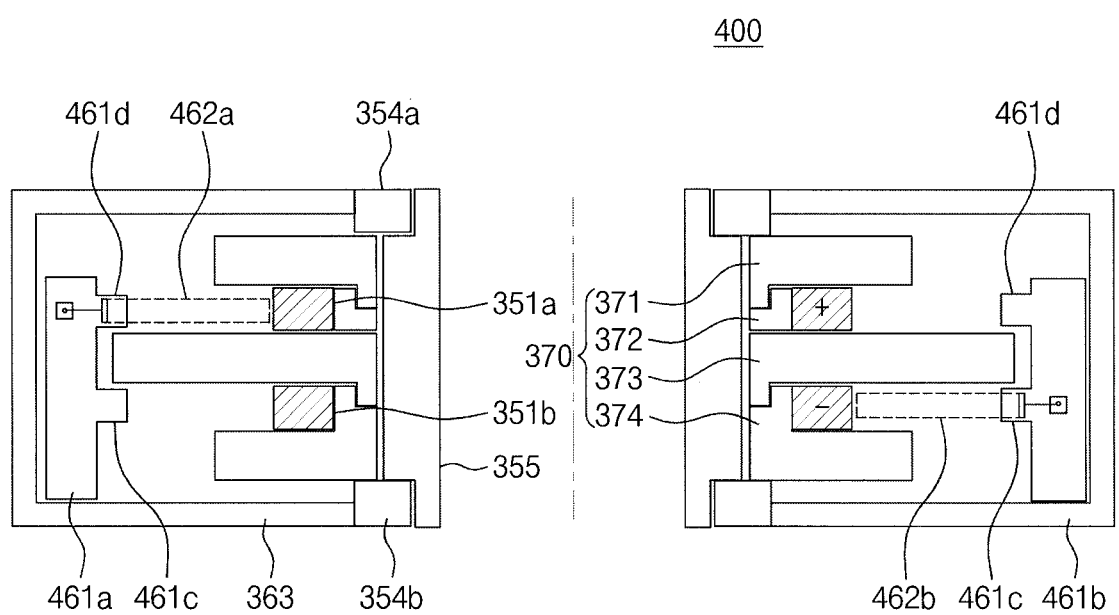
FIG. 13 is a cross-sectional view illustrating a rotating electrical connector for vacuum provided with the brush support part in FIG. 12.

FIG. 13 is a cross-sectional view illustrating a rotating electrical connector for vacuum provided with the brush support part in FIG. 12.

Referring to FIGS. 12 and 13, a rotating electrical connector for vacuum 400 includes a rotator 355 formed of an insulating material and having a cylindrical shape, an upper bearing 354a disposed on an upper side surface of the rotator 355, a lower bearing 354b vertically aligned with the upper bearing 354a and disposed on a lower side surface of the rotator 355, an upper conductive ring 351a and a lower conductive ring 351b disposed to cover side surfaces of the rotator 355 and spaced apart from each other, a washer-shaped insulating barrier 370 disposed between the upper conductive ring 351a and the lower conductive ring 351b and disposed to cover the rotator 355, a stator 363 disposed to be in contact with the upper bearing 354a and the lower bearing 354b and to cover the insulating barrier 370, the upper conductive ring 354a, and the lower conductive ring 354b, an upper brush 462a disposed to be in electrical contact with the upper conductive ring 354a, and a lower brush 462b disposed to face the upper brush 462a so as not to overlap the upper brush 462a with respect to a central axis of the stator 363 in an azimuthal direction.

The upper brush 462a and the lower brush 462b may be spaced apart from each other in the azimuthal direction so as not to overlap each other. In detail, the upper brush 462a and the lower brush 462b may be disposed at regular intervals of 180 degrees with respect to the central axis of the stator 363.

The insulating barrier 370 may be disposed to have a minimum tolerance with the upper brush support portion 461a to suppress parasitic discharge between the upper brush 462a and the lower conductive ring 354b. Each of the upper brush support portion 461a and the lower brush support portion 461b may have an arc shape to reduce a parasitic discharge space. Each of the upper brush support portion 461a and the lower brush support portion 461b may have an arc shape. The upper brush support portion 461a and the lower brush support portion 461b may include a lower protruding portion 461c and an upper protruding portion 461d protruding from internal side surfaces thereof, respectively. A portion of the lower brush 462b may be embedded in the lower protruding portion to be insulated. In addition, a portion of the upper brush 462a may be embedded in the upper protruding portion to be insulated.

The insulating barrier 370 may include an upper insulating barrier 371 guiding the upper brush 462a, a lower insulating barrier 374 guiding the lower brush 462b, and an intermediate insulating barrier 373 insulating and guiding the upper brush 462a and the lower brush 462b. An upper auxiliary insulating barrier 372 may be disposed between the upper insulating barrier 371 and the intermediate insulating barrier 373. Components, constituting the insulating barrier 370, may provide a serpentine parasitic discharge path to suppress internal parasitic discharge of the upper brush 462a and the lower conductive ring 354b.

Figure 14:
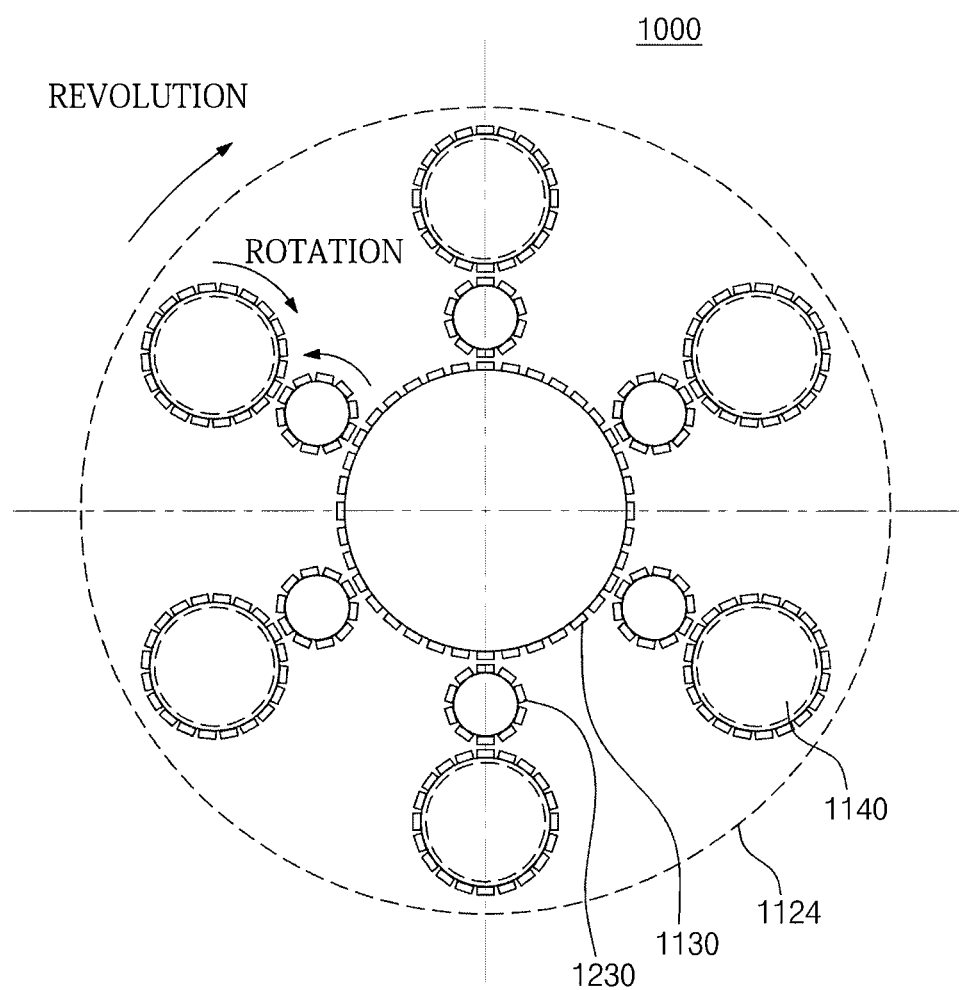
FIG. 14 is a plan view illustrating a magnetic gear of a substrate processing apparatus according to an example embodiment of the present disclosure.

FIG. 14 is a plan view illustrating a magnetic gear of a substrate processing apparatus according to an example embodiment of the present disclosure.

Figure 15:
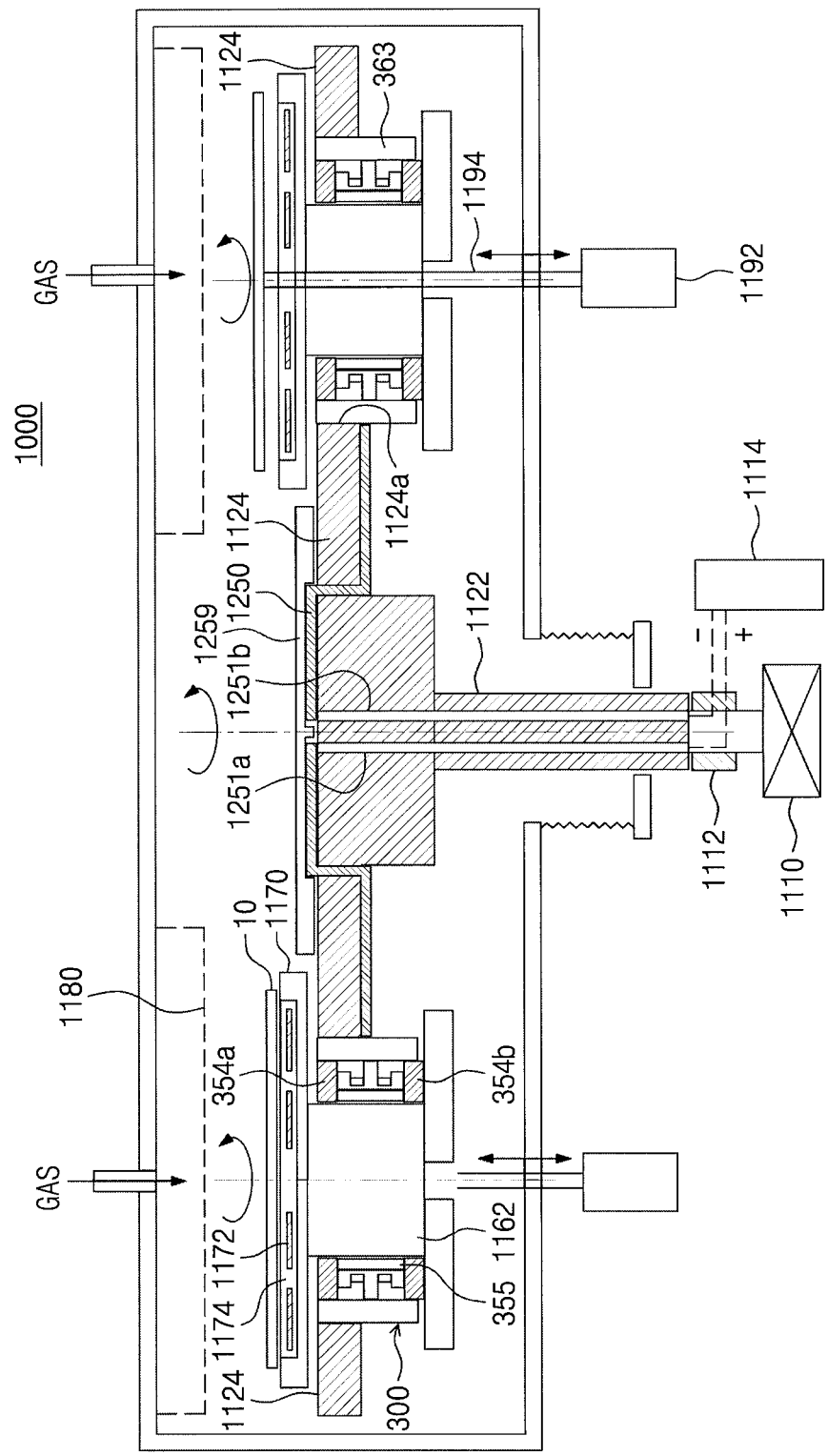
FIG. 15 is a cross-sectional view illustrating the substrate processing apparatus in FIG. 14.

FIG. 15 is a cross-sectional view illustrating the substrate processing apparatus in FIG. 14.

Figure 16:
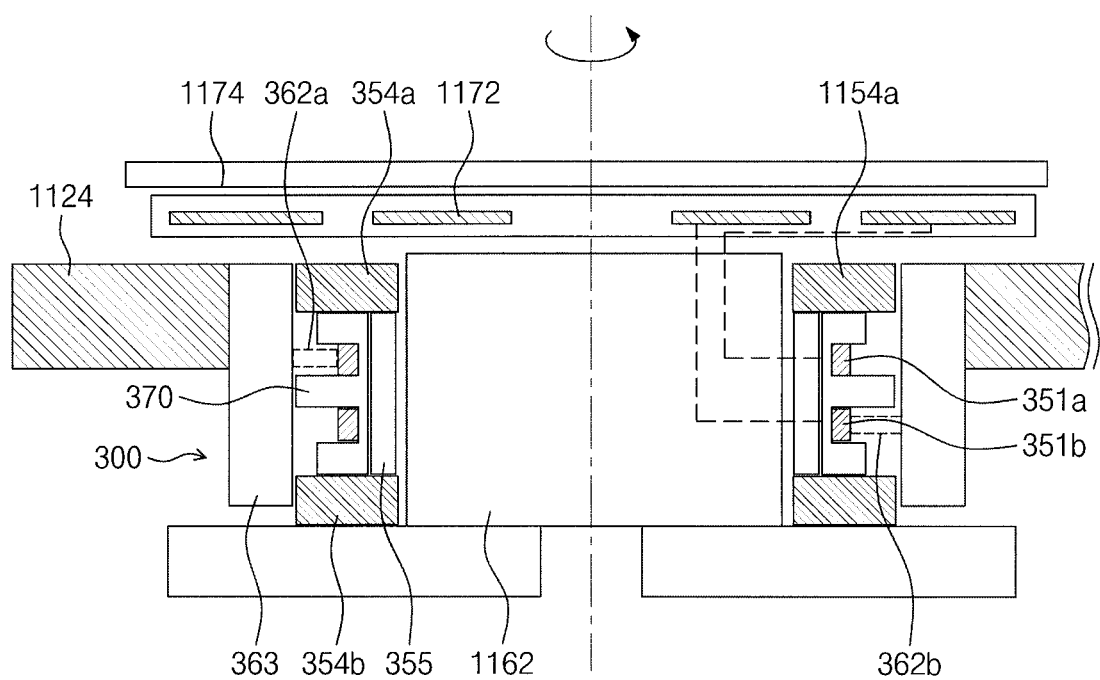
FIG. 16 is an enlarged view illustrating an electrostatic chuck and a rotating electrical connector in FIG. 14.

FIG. 16 is an enlarged view illustrating an electrostatic chuck and a rotating electrical connector in FIG. 14.

Referring to FIGS. 14 to 16, a substrate processing apparatus 1000 according to an example embodiment includes a first disk 1124 having a plurality of seating holes 1124a periodically arranged on a constant radius from a central axis thereof and disposed inside a chamber to rotate, a plurality of electrostatic chucks 1170 disposed respectively in the seating holes 1124a and rotating while revolving with rotation of the first disk 1124, and first rotating electrical connectors 300 disposed respectively in the seating holes 1124a to prove electrical connection while providing a rotational motion to the electrostatic chucks 1170. The first rotating electrical connector 300 may be the above-described rotating electrical connector for vacuum 300.

Each of the first rotating electrical connectors 300 may include a rotator 355 formed of an insulating material and having a cylindrical shape, an upper conductive ring 351a and a lower conductive ring 351b disposed to cover side surfaces of the rotator 355 and spaced apart from each other, and an insulating barrier 370 disposed between the upper conductive ring 351a and the lower conductive ring 35 lb. The insulating barrier 370 blocks generation of plasma between the upper conductive ring 351a and the lower conductive ring 35 lb.

Each of the first rotating electrical connectors 300 may include a rotator 355 formed of an insulating material and having a cylindrical shape, an upper bearing 354a disposed on an upper side surface of the rotator 355, a lower bearing 354b vertically aligned with the upper bearing 354a and disposed on a lower side surface of the rotator 355, an upper conductive ring 351a and a lower conductive ring 351b disposed to cover side surfaces of the rotator 355 and spaced apart from each other, an insulating barrier 370 disposed between the upper conductive ring 351a and the lower conductive ring 351b and disposed to cover the rotator 355, a stator 363 disposed to be in contact with the upper bearing 354a and the lower bearing 354b and to cover the insulating barrier 370, the upper conductive ring 351a, and the lower conductive ring 351b, an upper brush 362a dispose to be in electrical contact with the upper conductive ring 351a; and a lower brush 362b rotating in an azimuthal direction with respect to a central axis of the stator 363 so as not to overlap the upper brush 362a.

The chamber 1102 may be a cylindrical chamber. The chamber 1102 may perform a thin film deposition process or a substrate surface treatment process. A gas distribution unit 1180 may be disposed on an internal upper surface of the chamber 1102. The gas distribution unit 1180 may have a toroidal shape having a rectangular section. A lower surface of the gas distribution unit 1180 may include a plurality of gas injection holes through which a gas may be injected to the substrate 10 to perform a deposition process. The electrostatic chucks 1170 may be periodically disposed on the lower surface of the gas distribution unit 1180 at a constant radius.

The first disk 1124 may be a circular plate. The first disk 1124 may rotate about a central axis thereof. The first disk 1124 may include a plurality of seating holes 1124a disposed on a circumference having a constant radius at regular intervals. The number of the seating holes 1124a may be six. A power distribution unit 1250 may be disposed on an upper surface of the disk 1124.

The second disk 1162 may be inserted into the seating hole 1124a or the first rotating connector structure 300. The rotating plate 162 may revolve with the rotation of the disk 124. The second disk 1162 may revolve with rotation of the first disk 1124. The second disk may rotate while revolving through magnetic gears 1140, 1130, and 1230. Angular speed of the rotation may be determined by a gear ratio of the magnetic gear. The second disk 1162 may have a circular plate shape, and may be formed of a material such as a metal, graphite, quartz, or the like. The second disk 1162 may support the electrostatic chuck 1170 and may be coupled to the first magnetic gear 1140.

The first rotating connector 300 may be disposed to cover the second disk 162 and may be inserted into the seating hole 1124a. Each of the upper bearing 354a and the lower bearing 354b may have a toroidal shape. The rotator 355 may be disposed between the upper bearing 354a and the lower bearing 354b, and may be rotatable and be electrically insulated or be formed of an insulating material.

The electrostatic chuck 1170 may be disposed on an upper surface of the second disk 1162. The electrostatic chuck 1170 may receive power from a lead line extending through a lead line path formed in the second disk 1162. The electrostatic chuck 1170 may have a lead line path and a lead line, passing through the lead line path, may perform electrical connection with an electrostatic electrode. The electrostatic chuck 1170 may include an insulating member 1174 and a pair of electrostatic electrodes 1172 embedded in the insulating member 1174. The electrostatic chuck 1170 may operate as a bipolar electrostatic chuck. A lower surface of the electrostatic chuck 1170 may be higher than an upper surface of the first disk 1124. The insulating member 1174 may be disposed to cover the pair of electrostatic electrodes 1172. A thickness of the lower insulating member, disposed on a lower surface of the electrostatic electrode 1172, may be higher than a thickness of the upper insulating member disposed on an upper surface of the electrostatic electrode 1172. The lower insulating member may be formed on an electrostatic chuck body through thermal spray coating and may be coated by printing the electrostatic electrode 1172. After the electrostatic electrode is patterned, the upper insulating member may be formed through thermal spray coating. The insulating member 1174 may supply Coulomb-type electrostatic force or Johnsen-Rahbek type electrostatic force depending on resistivity. Each of the pair of electrostatic electrodes 1172 may have a washer shape of concentric structure. A second electrostatic electrode may cover the first electrostatic electrode with the concentric structure, and the pair of electrostatic electrodes 172 may be disposed on the same plane.

The electrostatic electrode 1172 may include a first electrostatic electrode and a second electrostatic electrode having a concentric structure, and a high DC voltage may be applied between the first electrostatic electrode and the second electrostatic electrode. Accordingly, the substrate disposed on the electrostatic chuck 1172 may be fixed by electrostatic suction force.

A first disk central shaft 1122 may extend from a central axis of the first disk 1124 in a direction of a lower surface of the chamber 1102. A second disk central shaft 1122 may have a cylindrical shape and may have a lead line path in which a lead line may be disposed. A portion of the power distribution unit 1250 may be disposed on the lead line path. The first disk central axis 1122 may be fixedly coupled to the first disk 1124.

A second rotating electrical connector 1112 may be axially coupled to one end of the first disk central shaft 1122 penetrating through a bellows structure 1116 and may provide electrical connection while providing a rotational motion. The second rotating electrical connector 1112 may perform substantially the same function as the first rotating electrical connector 300. The second rotating connector structure 1112 may be a slipring. A brush may be connected to the power supply 1114, and may supply power to a lead line disposed on a lead line path extending along the first disk central shaft 1122 rotating through the second rotating electrical connector 1112. The power may be supplied to the electrostatic chuck 1170 to the electrostatic chuck 1170 through the rotating electrical connector 300. The external DC power supply 1114 may output a positive DC voltage and a negative DC voltage.

A rotation driving unit 1110 may be coupled to one end of the first disk central shaft 1112 to rotate the first disk central shaft 1122. The rotation driving unit 1110 may be a motor. According to elasticity of the bellows structure 1116, the rotation driving unit 1110, the rotating electrical connector 1112, the first disk central shaft 1122, and the first disk 1124 may vertically move.

First magnetic gears 1140 may be respectively fixed to lower surfaces of the second disks 1162 to provide rotational force to the second disk 1162 and the electrostatic chuck 1170. The second magnetic gear 1130 may be disposed below the first disk 1124 to be fixed to the chamber 1102. Third magnetic gears 1230 may be rotatably fixed to the lower surface of the first disk 1124 and may be respectively disposed between the first magnetic gears 1140 and the second magnetic gear 1130 to adjust a rotation ratio. As the first disk 1124 revolves, the first magnetic gears 1140 and the third magnetic gears 1230 may rotate.

Each of the electrostatic chuck 1170 and the second disk 1162 may have at least three vertical through-holes. The vertical through-holes may be vertically aligned with each other in the electrostatic chuck 1170 and the second disk 1162. When the first disk 1124 and the second disk 1162 are stopped, a lift pin 1194 lifting the substrate may be inserted through the vertical through-hole. The lift pin 194 may be vertically and linearly moved by a lift pin driving unit 192.

The power distribution unit 1250 may include power pillars 1251a and 1251b, disposed to penetrate through the first disk central shaft 1122, and a plug extending from an upper surface and a lower surface of the first disk 1124 and penetrating through the first disk 1124. The power distribution unit 1250 may extend along an inside, an upper surface, and/or a lower surface of the first disk 1124 and may distribute a high voltage to electrostatic chucks. An upper cover 1259 may be disposed on the first disk 1124 and may be disposed to cover a portion of the power distribution unit 1250.

As described above, according to an example embodiment, a power distribution unit provides a symmetrical structure and the same wiring length to provide substantially the same electrical characteristics to all electrostatic chucks. Thus, suction forces of all of the electrostatic chucks may be the same.

According to an example embodiment, the power distribution unit may provide ease of decoupling/coupling by arranging a wiring on an upper surface of a first disk.

According to an example embodiment, in order to adjust a rotation period of a rotating first magnetic gear, a third magnetic gear may be disposed between a fixed second magnetic gear and the first magnetic gear to provide an appropriate rotation period of the first magnetic gear.

A rotating electrical connector according to an example embodiment may increase a height of an intermediate insulating barrier, disposed between a pair of electrode rings, such that a parasitic discharge path is increased to suppress parasitic discharge.

In the rotating electrical connector according to an example embodiment, a first brush charged with a positive high voltage and a second brush charged with a negative high voltage may be sufficiently spaced apart from each other to suppress parasitic discharge between the first brush and the second brush.

According to an example embodiment, a substrate processing apparatus including the rotating electrical connector may stably apply a high voltage to an electrostatic chuck, rotating and revolving at the same time, without parasitic discharge to provide sufficient substrate adsorption force.

Although the present disclosure and its advantages have been described in detail, it should be understood that various changes, substitutions and alterations can be made herein without departing from the spirit and scope of the disclosure as defined by the following

What is claimed is:

1. A rotating electrical connector for vacuum, comprising:
    a rotator formed of an insulating material and having a cylindrical shape;
    an upper conductive ring and a lower conductive ring disposed to cover side surfaces of the rotator and spaced apart from each other; and
    an intermediate insulating barrier disposed between the upper conductive ring and the lower conductive ring,
    wherein the intermediate insulating barrier blocks generation of plasma between the
    upper conductive ring and the lower conductive ring.

2. The rotating electrical connector as set forth in claim 1 further comprising:
    an upper insulating barrier disposed above the upper conductive ring; and
    a lower insulating barrier disposed below the lower conductive ring,
    wherein the intermediate insulating barrier protrudes further in an external radius direction than the upper insulating barrier and the lower insulating barrier.

3. The rotating electrical connector as set forth in claim 2 further comprising:
    an upper bearing disposed on an upper side surface of the rotator;

a lower bearing vertically aligned with the upper bearing and disposed on a lower side surface of the rotator; and a stator disposed to be in contact with the upper bearing and the lower bearing and to cover the upper insulating barrier, the lower insulating barrier, and the intermediate insulating barrier.

4. The rotating electrical connector as set forth in claim 3 further comprising:

a first insulating brush support portion disposed in an internal space of the stator;

an upper brush fixed to the first insulating brush support portion and is in electrical contact with the upper conductive ring;

a second insulating brush support portion disposed in the internal space of the stator and e disposed to face the first insulating brush support portion; and a lower brush fixed to the second insulating brush support portion and is in electrical contact with the lower conductive ring;

wherein the upper brush and the lower brush are formed of a conductive wire having elasticity or a strip and have a "U" shape.

5. The rotating electrical connector set forth in claim 3, wherein the upper insulating barrier or the intermediate insulating barrier protrudes to be in contact with an internal side surface of the upper conductive ring, wherein the lower insulating barrier or the intermediate insulating barrier protrudes to be in contact with an internal surface of the lower conductive ring.

6. The rotating electrical connector as set forth in claim 3, wherein the stator has a cylindrical shape, and has a cutting surface formed by vertically cutting a portion of a side surface of the stator, wherein an input connector insulation block extends in a length direction and is disposed along the cutting surface, wherein each of a first input terminal and a second input terminal ise spaced apart from the input connector insulating block.

7. The rotating electrical connector as set forth in claim 3, further comprising:

a top auxiliary insulating barrier disposed between the top insulating barrier and the intermediate insulating barrier, wherein an inner side surface of the top insulating barrier protrudes in a direction of the intermediate insulating barrier, wherein an inner side surface of the intermediate insulating barrier protrudes in a direction of the bottom insulating barrier, wherein an inner surface of the bottom insulating barrier protrudes a direction of the intermediate insulating barrier to be coupled to a protrusion of the intermediate insulating barrier with a step.

8. The rotating electrical connector as set forth in claim 7, wherein the top auxiliary insulating barrier is coupled to a protrusion of the top insulating barrier with a step.

9. The rotating electrical connector as set forth in claim 8, further comprising:

a top brush support supporting a top brush; and a bottom brush support supporting a bottom brush;

wherein each of the top brush support and the bottom brush support has an arc shape, wherein a portion of the bottom brush is buried in the bottom brush support to be insulated, and a portion of the top brush is buried in the top brush support to be insulated.

10. A rotating electrical connector for vacuum, comprising:

a cylindrical rotator formed of an insulating material;

a top bearing disposed on a top side surface of the rotator;

a bottom bearing vertically aligned with the top bearing and disposed on a bottom side surface of the rotator;

a top conductive ring and a bottom conductive ring disposed to cover a side surface of the rotator and spaced apart from each other;

an insulating barrier disposed between the top conductive ring and the bottom conductive ring, disposed to cover the rotator, and having a washer shape;

a stator disposed to be in contact with the top bearing and the bottom bearing and disposed to cover the insulating barrier and the top and bottom conductive rings;

a top brush disposed to be in electrical contact with the top conductive ring and;

a bottom brush rotating in an azimuthal direction with respect to the center axis of the stator to be disposed in order not to overlap the top brush.

11. A substrate processing apparatus, comprising:

a first disk having a plurality of seating holes periodically arranged on a constant radius from a center axis and disposed inside a chamber to rotate, a plurality of electrostatic chucks which rotates while revolving with the rotation of the first disk, and a plurality of first rotary electrical connectors which are disposed in the seating holes to provide an electrical connection while providing a rotation motion to the plurality of electrostatic chuck, respectively, each of the first rotary electrical connectors comprises:

a cylindrical rotator formed of an insulating material, a top conductive ring and a bottom conductive ring disposed to cover a side surface of the rotator and spaced apart from each other, and an insulating barrier disposed between the top conductive ring and the bottom conductive ring, wherein the insulating barrier blocks plasma generation of the top conductive ring and the bottom conductive ring.

* * * * *